United States Patent [19]

Usuda et al.

[11] Patent Number: 5,321,300
[45] Date of Patent: Jun. 14, 1994

[54] LASER-BROKEN FUSE

[75] Inventors: Yoshio Usuda, Yokohama; Hiroaki Itaba, Tokyo; Jumpei Kumagai, Yokohama; Seiji Kaki, Tokyo, all of Japan

[73] Assignee: Kabushiki Kaisha Toshiba, Kawasaki, Japan

[21] Appl. No.: 865,681

[22] Filed: Apr. 8, 1992

Related U.S. Application Data

[63] Continuation of Ser. No. 696,095, May 6, 1991, abandoned.

[30] Foreign Application Priority Data

May 8, 1990 [JP] Japan .................................. 2-116837

[51] Int. Cl.⁵ .................... H01L 27/02; H01L 23/48
[52] U.S. Cl. ................................. 257/529; 257/754; 257/758; 257/760; 257/775
[58] Field of Search ................ 357/51, 54, 59, 68, 357/71; 257/529, 754, 758, 760, 775

[56] References Cited

U.S. PATENT DOCUMENTS 4,826,785 5/1989 McClure et al. .................... 437/174
4,935,801 6/1990 McClure et al. ....................... 357/51

FOREIGN PATENT DOCUMENTS

| 3223619A1 | 2/1983 | Fed. Rep. of Germany . |
| 52-28280 | 3/1977 | Japan .................................. 357/51 |
| 58-00170 | 1/1983 | Japan . |
| 58-64061 | 4/1983 | Japan .................................. 357/51 |
| 61-51966 | 3/1986 | Japan .................................. 357/51 |
| 63-003432 | 1/1988 | Japan . |

*Primary Examiner*—Mark V. Prenty
*Attorney, Agent, or Firm*—Finnegan, Henderson, Farabow, Garrett & Dunner

[57] ABSTRACT

In a laser-broken fuse used in a memory redundancy technique, an aluminum wiring layer is formed on an interlevel insulating film. A portion of the wiring layer is selected to be broken to shut off conduction of the layer. A polysilicon-made heat member is provided in the interlevel insulating film at the place which is underneath the selected portion. The heat member is located on a field insulating film. This heat member generates heat by absorbing energy from a laser beam, and thermal-explodes in a sealed atmosphere so as to break the selected portion.

17 Claims, 6 Drawing Sheets

LASER-BROKEN FUSE

This application is a continuation of application Ser. No. 07/696,095 filed May 6, 1991, now abandoned.

BACKGROUND OF THE INVENTION

1. Field of the Invention

The present invention relates to a laser-broken fuse, more particularly to that used for a semiconductor device.

2. Description of the Related Art

Conventionally, to prepare a laser-broken fuse used in a memory redundancy technique, a filament fuse made of polysilicon, or molybdenum silicide, etc., is formed on a field oxide film as a part of a wiring layer. On this laser-broken fuse, an interlevel insulating film and a protection layer consisting of a CVD silicon oxide film, BPSG film, PSG film, etc., are formed.

A laser-broken fuse having the above-mentioned structure itself generates heat, and breaks when the heat of the fuse itself exceeds a certain point by irradiation of a laser beam thereon.

At present, as the memory devices are developing rapidly in high integration and mass storage, many more layers are formed in multilayered internal wiring layers, especially wiring layers made of aluminum or copper. In a memory device comprising such a multilayered wiring, the thicknesses of the insulating films such as interlevel insulating film, etc., located close to the fuse, are inevitably increased.

The thickness-increased films, namely, thick insulating films, loaded on a fuse serve to suppress the thermal-explosion force, thereby interfering with breaking of the fuse.

In multilayered wiring device, this problem can be solved by thinning that part of the insulating film which is located on the territory of the fuse to an appropriate thickness for breaking the fuse.

However, in reality, it is very difficult to control, by etching, the thickness of the insulating film since accuracy of the etching varies from time to time.

Meanwhile, the technique for breaking a wiring layer, the main component of which is aluminum or copper, by laser, has not yet been completely realized due to the problem of aluminum or copper not absorbing but reflecting the laser beams. For example, if the intensity of the laser beams is greatly increased to overcome the above problem, the intensity may have to be raised high enough to even damage the field oxide film.

To reiterate, with conventional techniques, it has been very difficult to break a semiconductor device including a multilayered wiring since a fuse made of polysilicon, etc., is located deep within the layer of the apparatus. Further, yielding of the products is accordingly low.

In addition, the technique for breaking a fuse, that is a wiring layer, the main component of which is aluminum or copper, by means of laser, has not yet completely realized.

SUMMARY OF THE INVENTION

The present invention has been developed in consideration of the above-mentioned problem, and the first purpose thereof is to realize a technique for breaking a fuse comprising a wiring layer containing aluminum or copper as its main component by laser.

The second purpose of the invention is to provide a laser-broken fuse, especially for a product including a multilayered wiring, having a structure by which breaking of the fuse by laser can be simplified, and accuracy of breaking of the fuse can be improved.

The above-mentioned purposes can be achieved with a laser-broken fuse having a structure as follows:

The fuse according to the present invention, comprises a wiring layer formed on the first insulating film on a substrate, a selected portion of the wiring layer selected to be broken to shut off a conductive state of said wiring layer, said selected portion is made of substantially the sam material as that of the rest of the wiring layer, and a heat member provided on the substrate underneath the selected portion, said heat member being made of a material which generates heat by absorbing the energy of a laser beam.

As described above, the heat member is made of a material which generates heat by absorbing energy of the laser, and may thermal-explode in a sealed atmosphere. Further, according to the present invention, the second insulating film may be provided between the substrate and the heat member. In this case, the heat member is leveled with a conductive layer on the second insulating film. The heat member may be made of a material containing silicon as its main component, such as polysilicon, molybdenum silicide, titanium silicide, or tungsten silicide. Meanwhile, the wiring layer may contain aluminum or copper as its main component. The wiring layer and the heat member may be connected with each other by heat conductive means. In addition, the maximum length taken in the plane of the heat member is no more than the diameter of a laser beam.

The laser-broken fuse according to the present invention has a heat member located underneath the wiring layer; therefore if the wiring layer is not made of a laser-absorbing material, heat generated in the heat member by the laser can be propagated to the wiring layer. Thus, the wiring layer can be heated up to a point where it can easily break.

Further, the connection between the wiring layer and the heat member enhances the heat conductivity therebetween, thereby increasing the temperatures of the heat member and the to-be-broken portion of the wiring layer more efficiently.

With this structure, the wiring layer may be made of a material containing aluminum or copper as its main component, which could not be broken by laser with conventional techniques, and therefore the internal wiring layer itself of a semiconductor device can be made into a fuse.

Additionally, the heat member may be made of a material containing silicon, as its main component, which is the sam kind as that of the internal wiring layer of the semiconductor device. Such a material tends to absorb laser beam energy, so that the temperature of heat generated by the heat member becomes higher, increasing the possibility of thermal-explosion of itself. Thus, the wiring layer located above the heat member can be broken.

According to the present invention, a fuse can comprise a wiring layer containing aluminum or copper as its main component, and therefore a laser-breaking technique for breaking such a fuse can be realized. Further, there is provided a laser-broken fuse having a structure which allows it to be broken by a laser more simply, and with greater accuracy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

Figure 1:
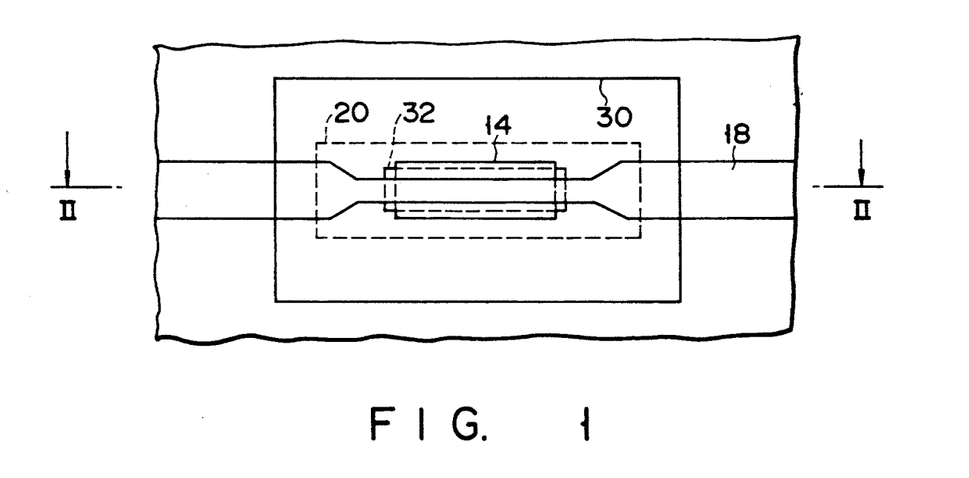
FIG. 1 is a plan view of a device according to the first embodiment of the present invention.
Figure 2:
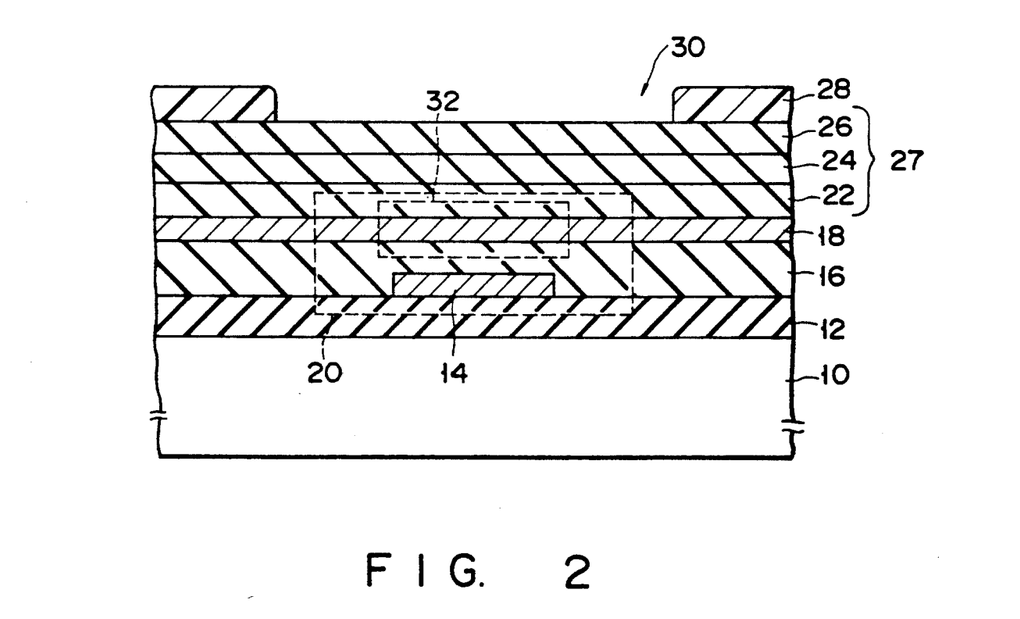
FIG. 2 is a cross section taken along the line II—II in FIG. 1.

As can be seen in FIGS. 1 and 2, a field insulating film 12 is formed on a silicon substrate 10, and a heat member 14 is formed on the film 12. Further, an interlevel insulating film 16 is formed on a heat member 14, and a wiring layer 18, the main component of which is aluminum (or may be copper), is formed on the insulating film 16.

In the present invention, the entire region including the heat member 14 and a selected portion 32 of the wiring layer 18 located thereabove, is regarded as a fuse. Thus, this region will be hereinafter called a laser-broken fuse 20.

A protective film 27 made of a CVD silicon oxide film 22, BPSG film 24, and PSG film 26, is formed on the wiring layer 18. A polyimide film 28 is formed on the protective layer 27, and an opening is made in the film 28 at the position corresponding to that of the fuse 20.

Laser beam (not shown) is radiated so that they reach as far as the heat member 14, the selected portion 32 of the entire wiring layer 18, which is a portion of the layer 18 located above the heat member.

The mechanism of breaking the fuse of the device according to the first embodiment will now be explained with reference to FIGS. 3A—3A, which are the same cross section as shown in FIG. 2, illustrating stages of the procedure in order from irradiation with the laser beam to breaking of the fuse. In these figures, the same numeral references designate like items as in FIGS. 1 and 2.

Figure 3A:
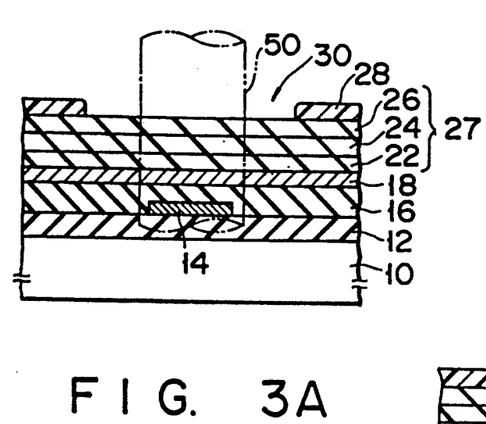
FIGS. 3A–3C show the cross section of the device in each of the steps of the breaking procedure according to the present invention.
Figure 3B:
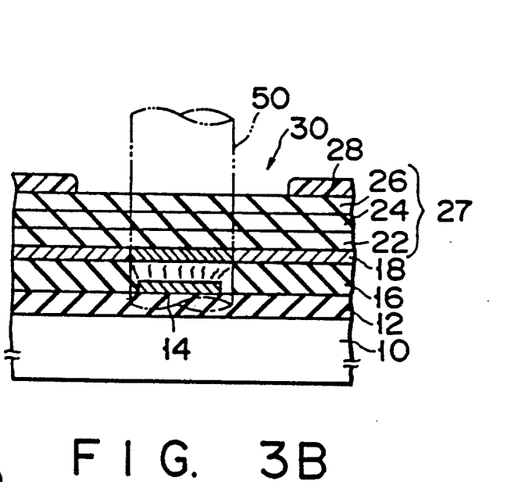
Figure 3C:
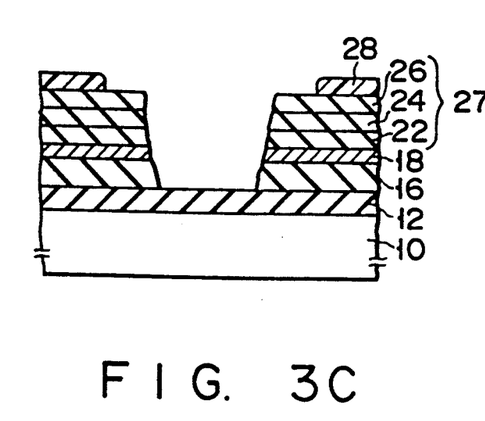

As can be seen in FIG. 3A, a section including the heat member 14, as well as the wiring layer 18 located thereabove is irradiated with a laser beam 50. As the irradiation time passes, the heat member 14 starts to generate heat, as is shown in FIG. 3B, and the heat of the member 14 is propagated to the wiring layer 18. Further, as is shown in FIG. 3C, if the temperature of the heat member 14 rises up to the point at which it melts and evaporates, the heat member 14 thermal-explodes, and blow the wiring layer 18 located thereabove away.

As described above, the explosion of the heat member 14 blows also the wiring layer 18, located thereabove, away, and thus the wiring layer 18 breaks.

Since the fuse 20 has the above-described structure, the heat of the heat member 14 is propagated to the wiring layer 18 so that the layer 18 is heated up to a temperature at which it can easily breaks. Therefore, the wiring layer 18 made of aluminum can serve as a fuse, and can be broken by the laser. Further, the wiring layer 18 is located usually an upper part of the device, above the polysilicon layer, and in fact it is close to the surface of the device. Consequently, the protective film 27 on the fuse 20 can be made very thin, thereby realizing a fuse appropriate especially for a semiconductor including a multilayered wiring. In addition, since the protective film 27 on the fuse 20 is very thin, etching of this film can be omitted from the procedure.

In the meantime, it is preferable that the heat member 14 be made of a material which can fully absorb laser beams. Some of the examples of such a material are polysilicon, molybdenum silicide, titanium silicide, tungsten silicide, etc., of which conventional laser-broken fuses are made. In general, these materials are used to form a gate electrode and the like in the device, and the gate electrode, etc. are located beneath the wiring layer 18. If one of these materials is used for the heat member 14, the member 14 can be formed simply by adding the pattern of the member 14 to the gate electrode pattern of the mask, for example, in the step for forming the gate electrode. Thus, the member 14 can be made without adding another step to the procedure.

In addition, since the heat member 14 is not a part of the wiring layer, materials other than the above-listed conductive ones can be used. Some of the examples are germanium (Ge) and gallium arsenide (GaAs).

Figure 4:
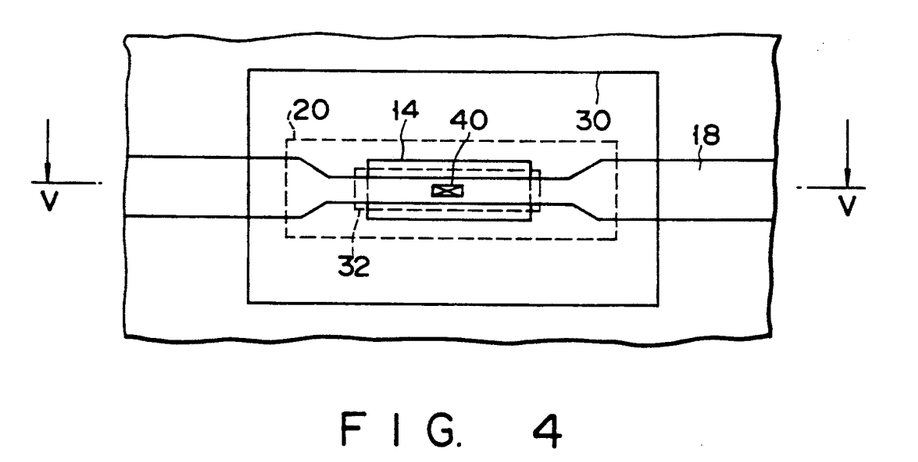
FIG. 4 is a plan view of the device according to the second embodiment of the present invention.
Figure 5:
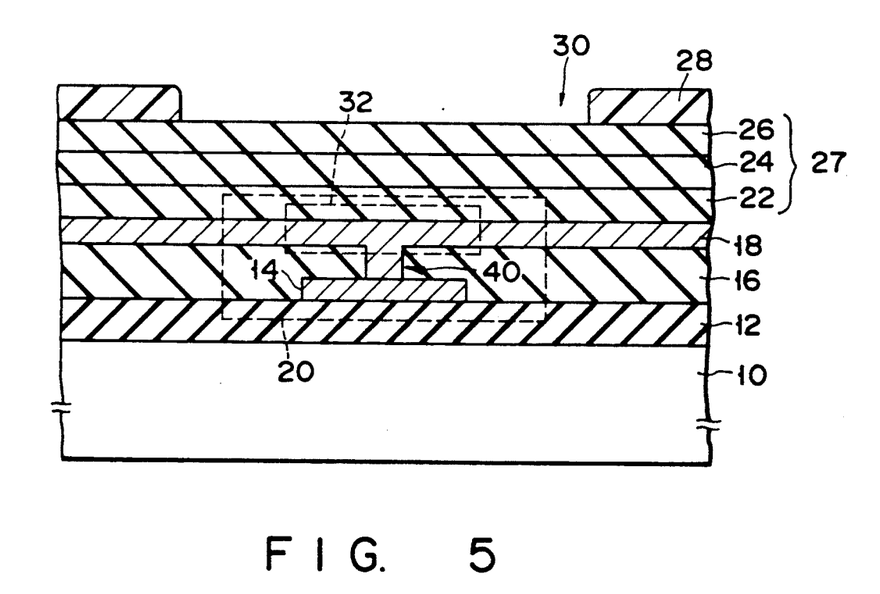
FIG. 5 is a cross section taken along the line V—V in FIG. 4.

The second embodiment of the present invention will now be explained with reference to FIGS. 4 and 5. In FIGS. 4 and 5, the same reference numerals designate like items as in FIGS. 1 and 2, and the explanations thereof are not repeated.

As can be seen in FIGS. 4 and 5, the second embodiment has a structure in which an opening 40 is made in an interlevel film 16 so as to connect the heat member 14 and the wiring layer 18 with each other.

According to a fuse 20 having the above-mentioned structure, heat of the heat member 14 can be propagated more quickly to the to-be-broken part or selected portion 32 of the wiring layer 18, and the temperatures of the heat member and the selected portion 32 can be more efficiently increased than the case of the first embodiment. Consequently, the wiring layer 18 becomes easily-breakable, and the time required for breaking can be shortened.

Further, in the present invention, it is preferable that the maximum possible measurement taken on the surface of the heat member be no more than the diameter of beams output from the laser beam 50. This is because, for example, if a piece of the heat member 14 still remains after breaking thereof, the piece may serve to connect the broken ends of the wiring layer with each other.

Figure 6:
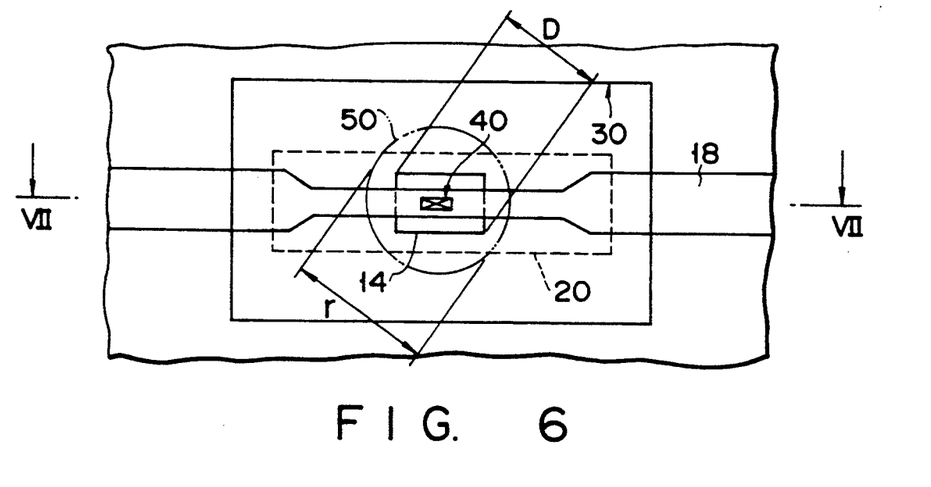
FIG. 6 is a plan view of preferable irradiation with laser beam.
Figure 7:
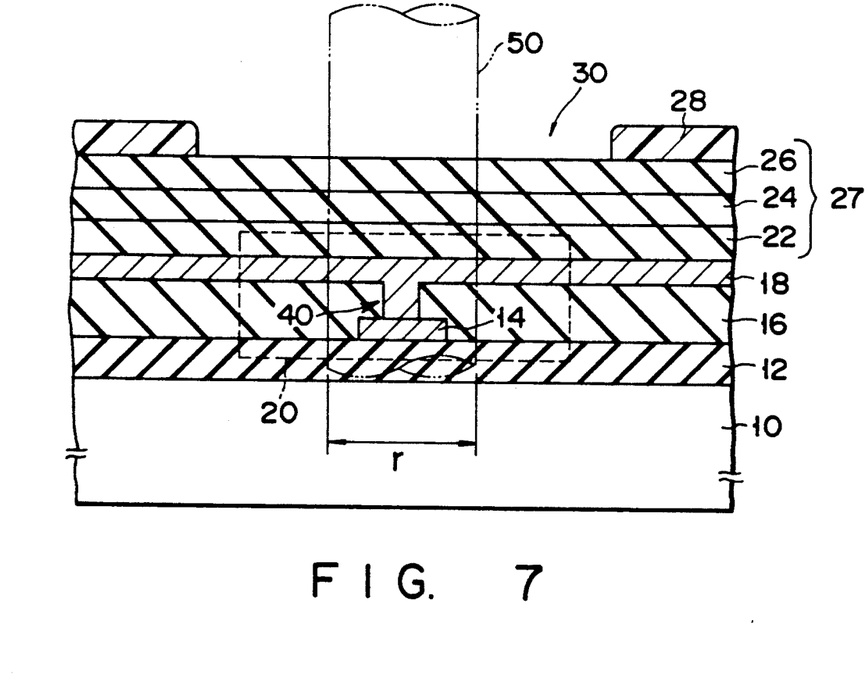
FIG. 7 is a cross section taken along the line VII—VII in FIG. 6.

FIG. 6 is a plan view showing a laser radiation onto the device in consideration of the above problem, and FIG. 7 is a cross section taken along the line VII—VII in FIG. 6. In FIGS. 6 and 7, the same numerals designate like items as in the figures mentioned so far.

As can be seen in FIGS. 6 and 7, beam diameter r is larger than maximum measure D taken on the surface of the heat member 14, and therefore the heat member 14 is located within the region irradiated with the laser beam 50.

The laser-broken fuse according to the present invention may be used in a manner of a regular conventional fuse. For example, a laser-broken fuse can be provided for a given number of wiring layers, such that a plurality of fuses are arranged alongside each other.

Figure 8:
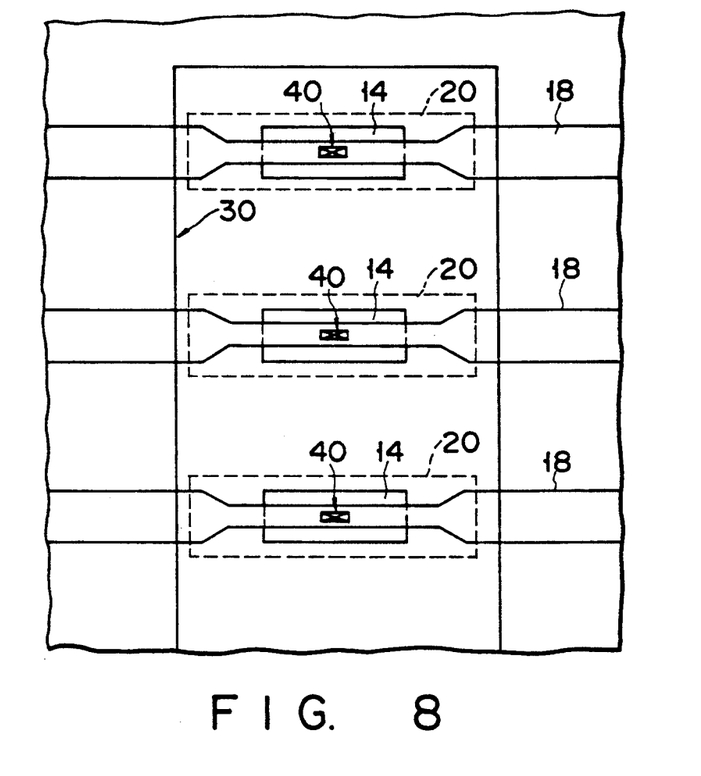
FIG. 8 is a plan view of the device according to the present invention, in which a plurality of fuses are arranged.

FIG. 8 is a plan view of an example of such an arrangement in a device as mentioned above. In FIG. 8, the same numerals designate like items in the other mentioned figures.

Figures 9, 10:
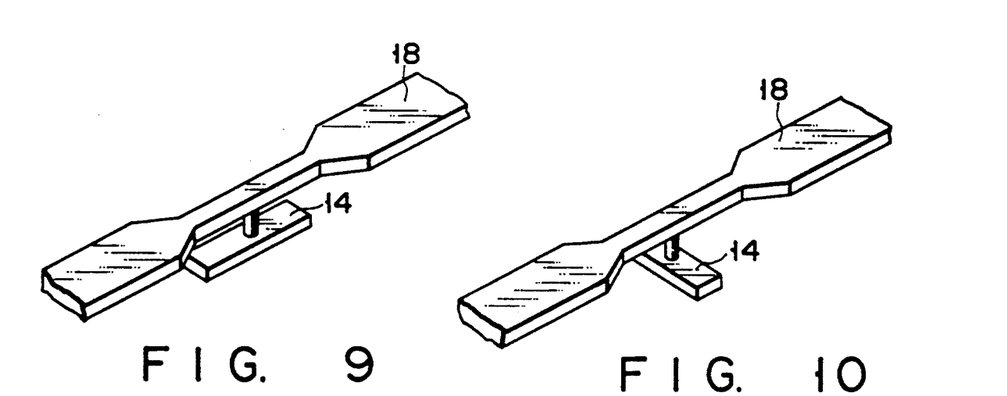
FIGS. 9 and 10 show diagonal views of the configuration of a heat member.

As shown in FIG. 9 as well as FIG. 10, the heat member 14 may be disposed such that it extends along with or across the wiring layer 18. That is, all that matters in the present invention is that the heat member 14 is formed underneath the to-be-broken portion of the wiring layer 18, and the manner in which it is disposed is quite arbitrary.

The third embodiment of the present invention will now be explained with reference to FIG. 11.

Figure 11:
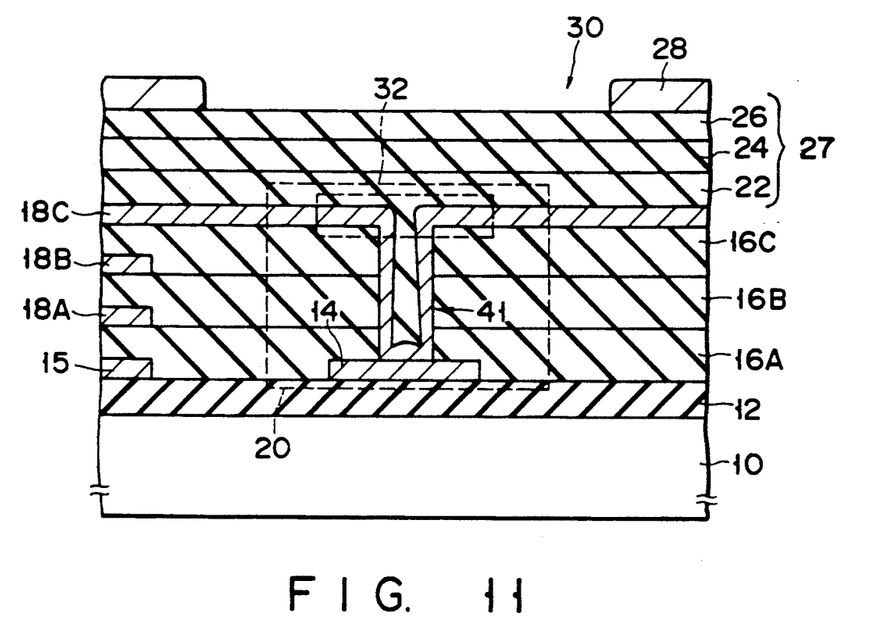
FIG. 11 is a cross section of a device according to the third embodiment of the present invention.

FIG. 11 is a cross section of a device according to the third embodiment of the present invention. In FIG. 11, the same numerals designate like items as in the other figures.

As can be seen in this figure, a heat member 14 and a wiring layer 15 formed of the same material as that of the heat member 14, for example, polysilicon, are formed on a field insulation layer 12. The first interlevel insulating film 16A is located on all these, and the first aluminum wiring layer 18A is formed on the insulating film 16. Further, the second interlevel insulating film 16B is formed on the layer 18A, and the second aluminum wiring layer 18B is formed on the film 16. The third interlevel insulating film 16C is located on the layer 18B, and the wiring layer 18C made of the third aluminum layer is formed on the insulating film 16C. The wiring layer 18C is connected to the heat member 14 via a through hole 41 which runs from the interlevel insulating films 16A through 16C to the heat member 14.

In the structure described above, the region including the heat member 14 and the wiring layer 18C located thereabove, is regarded as a fuse 20. A selected portion 32 of the wiring layer 18C, located directly above the heat member 14, is to be broken.

With such a device including a multilayered wiring, the heat member 14 located deep in the device and the wiring layer 18C located closest to the surface layer can be selected to form a fuse 20.

The fourth embodiment of the present invention will be described with reference to FIG. 12.

Figure 12:
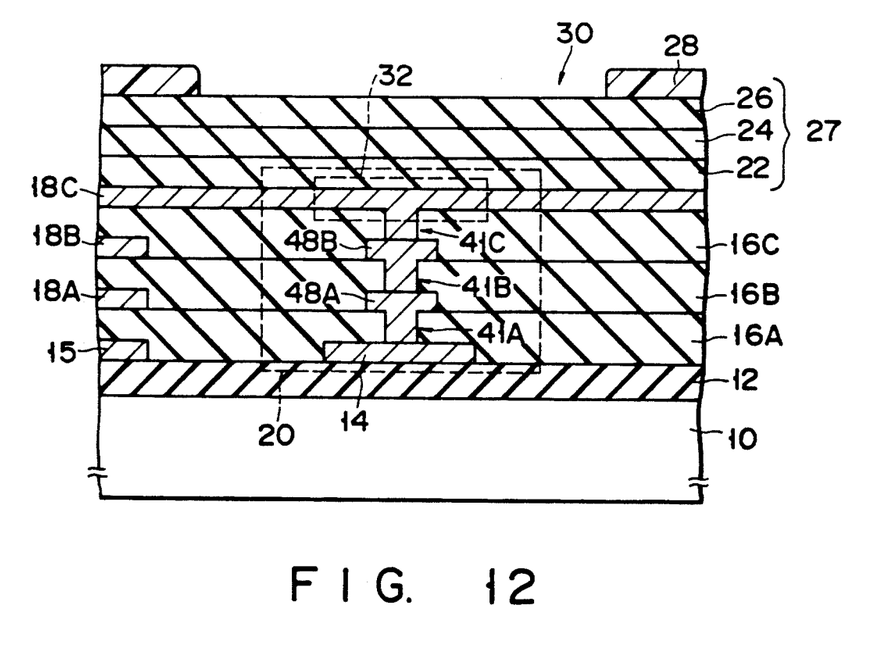
FIG. 12 is a cross section of a device according to the fourth embodiment of the invention.

FIG. 12 is a cross section of a device according to the fourth embodiment of the invention. As to FIG. 12, the same numerals designate like items as in FIG. 11, and the explanations thereof are not repeated.

As can be seen in FIG. 12, the first contact hole 41A is made in the first interlevel insulating film 16A so as to reach a heat member 14, and the first filling member 41A made from the first aluminum layer 18A is formed in the hole. The second contact hole 41B which runs up to the filling member 41A is made in the second interlevel insulating film 16B, and the second filling member 41B made from the second aluminum layer 18B is formed in the contact hole 41B. The third contact hole 41C which runs up to the filling member 41B is formed on the third interlevel insulating film 16C. Thus, the wiring layer 18C is connected to the filling member 41B via the contact hole 41C.

As described, in a case of a device including a multilayered wiring such as above, filling members 41A and 41B may be employed to connect a wiring layer 18C and a heat member 14 with each other.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A laser-broken fuse comprising:
   a substrate;
   a first insulating film formed on said substrate;
   a heat member formed on a first portion of said first insulating film and made of a material which generates heat by absorbing energy of a laser beam;
   a conductive layer formed on a second portion of said first insulating film and made of the same material as that of said heat member;
   a second insulating film formed on said first insulating film, said heat member, and said conductive layer; and
   a wiring layer including a selected portion located above said heat member, wherein said selected portion is not wider than other portions of said wiring layer and is narrower than said heat member, and said heat member comprises means for breaking the wiring layer at the selected portion.

2. A fuse according to claim 1, wherein said wiring layer and said heat member are connected with each other via a heat conductive member.

3. A fuse according to claim 1, wherein a portion of said wiring layer contacts said heat member through an aperture formed in said second insulating film.

4. A laser-broken fuse for a semiconductor device comprising:
   a substrate;
   a first insulating film formed on said substrate;
   a heat member formed on a first portion of said first insulating film and made of a material which generates heat by absorbing energy of a laser beam, and thermal-explodes in a sealed atmosphere;
   a conductive layer formed on a second portion of said first insulating film and made of the same material as that of said heat member;

a second insulating film formed on said first insulating film, said heat member, and said conductive layer; and a wiring layer including a selected portion located above said heat member, wherein said selected portion is not wider than other portions of said wiring layer and is narrower than said heat member, and said heat member comprises means for breaking the wiring layer at the selected portion.

5. A fuse according to claim 4, wherein said wiring layer and said heat member are connected with each other by connecting means made of the same material as that of said wiring layer and filling a contact hole formed in said second insulating film.

6. A fuse according to claim 4, wherein a portion of said wiring layer contacts said heat member through an aperture formed in said second insulating film.

7. A laser-broken fuse comprising:

a substrate;

a first insulating film formed on said substrate;

a heat member formed on said first insulating film and made of a material which generates heat by absorbing energy of a laser beam;

a second insulating film formed on said first insulating film and said heat member; and a wiring layer including a selected portion located above said heat member, wherein said selected portion is not wider than other portions of said wiring layer and is narrower than said heat member, and said wiring layer is formed on said second insulating film and connected to said heat member via a heat conductive member located in an aperture in said second insulating film.

8. A fuse according to claim 7, wherein said wiring layer contacts said heat member through the aperture in said second insulating film.

9. A laser-broken fuse according to claim 7, wherein said heat member comprises means for breaking the wiring layer at the selected portion.

10. A laser-broken fuse according to claim 7, wherein said selected portion is narrower than other portions of said wiring layer.

11. A laser-broken fuse comprising:

a substrate;

a first insulating film formed on said substrate;

a heat member formed on a first portion of said first insulating film and made of a material which generates heat by absorbing energy of a laser beam;

a first conductive layer formed on a second portion of said first insulating film;

a second insulating film formed on said first insulating film, said heat member, and said first conductive layer;

a second conductive layer formed on said second insulating film;

a third insulating film formed on said second insulating film and said second conductive layer;

a third conductive layer formed on said third insulating film;

a fourth insulating film formed on said third insulating film and said third conductive layer; and a wiring layer including a selected portion located above said heat member, wherein said selected portion is not wider than other portions of said wiring layer and is narrower than said heat member.

12. A fuse according to claim 11, wherein said wiring layer is formed on said fourth insulating film.

13. A laser broken fuse according to claim 11, wherein said heat member is made of a material which thermal-explodes in response to absorption of energy from a laser beam.

14. A laser broken fuse according to claim 11, wherein said wiring layer is coupled to said heat member via at least one heat conductive member located in apertures in said second, third and fourth insulating films.

15. A laser broken fuse according to claim 11, wherein said wiring layer contacts said heat member through apertures in said second, third, and fourth insulating films.

16. A laser-broken fuse according to claim 11, wherein said heat member comprises means for breaking the wiring layer at the selected portion.

17. A laser-broken fuse according to claim 11, wherein said selected portion is narrower than other portions of said wiring layer.

* * * * *